(12) United States Patent
Dambrauskas et al.

(10) Patent No.: US 7,427,565 B2
(45) Date of Patent: Sep. 23, 2008

(54) MULTI-STEP ETCH FOR METAL BUMP FORMATION

(75) Inventors: Tony Dambrauskas, Mesa, AZ (US); Ralph Lane, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 344 days.

(21) Appl. No.: 11/173,245

(22) Filed: Jun. 30, 2005

(65) Prior Publication Data

US 2007/0004190 A1    Jan. 4, 2007

(51) Int. Cl.
*H01L 21/44* (2006.01)

(52) U.S. Cl. .............. 438/687; 438/613; 438/667; 257/E21.575

(58) Field of Classification Search ......... 438/666–668, 438/612–614, 687; 257/E21.575
See application file for complete search history.

(56) References Cited

U.S. PATENT DOCUMENTS

| 6,706,622 B1 * | 3/2004 | McCormick ............... 438/614 |
| 6,716,737 B2 * | 4/2004 | Plas et al. ............... 438/612 |

* cited by examiner

*Primary Examiner*—Thanhha S. Pham

(57) ABSTRACT

The present invention uses a two step plasma etch process to create a via contact with an integral bump. After the via and bump have been plated, the semiconductor substrate is planarized to remove the excess metal, using the semiconductor substrate as a planar stop. The bulk silicon substrate surrounding the bumps are plasma etched back to expose the bumps for assembly.

23 Claims, 7 Drawing Sheets

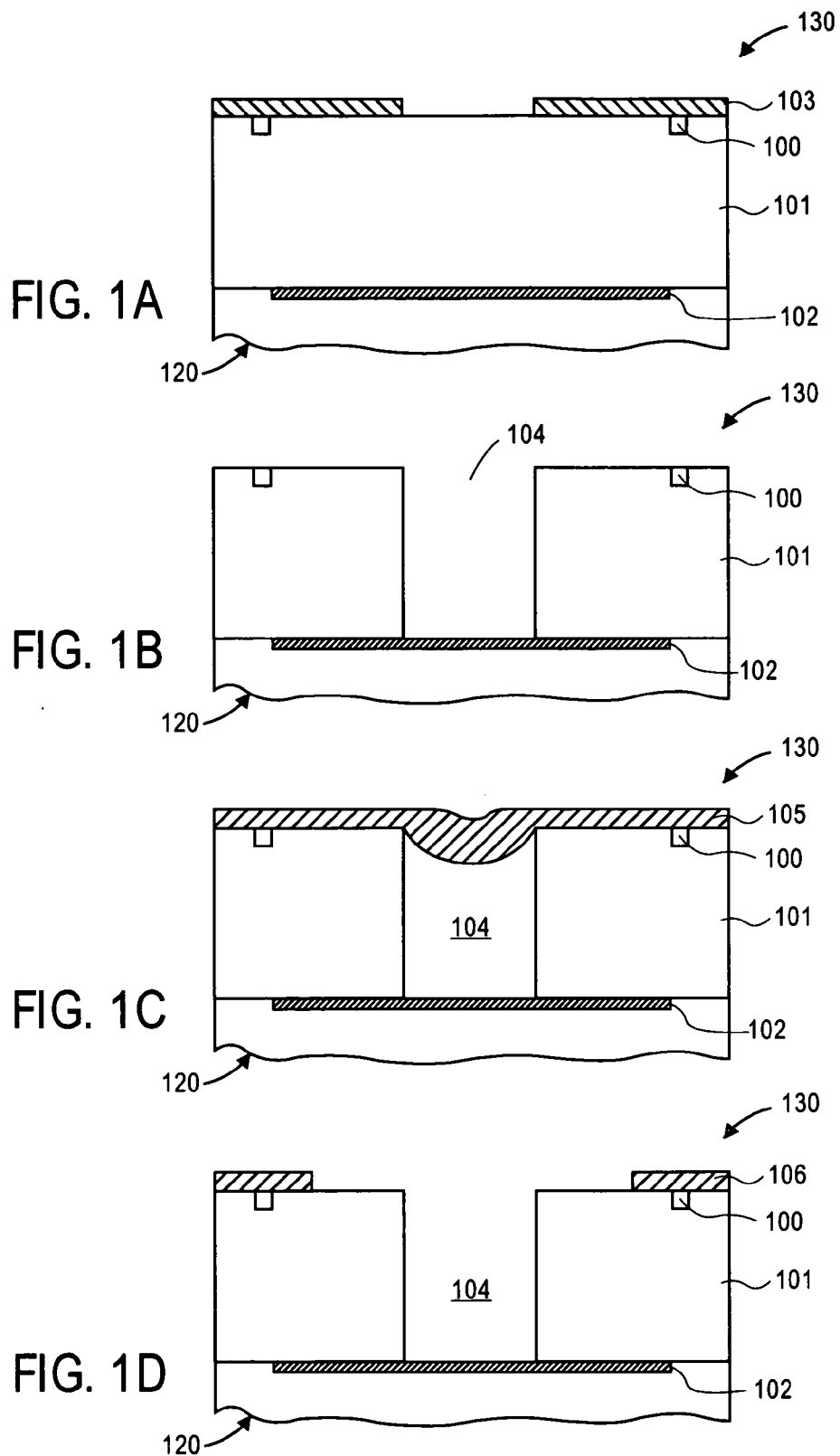

MULTI-STEP ETCH FOR METAL BUMP FORMATION

BACKGROUND

1. Field

The present invention relates to the field of semiconductor manufacturing, specifically a through via contact formation process, which features a multi-step etch to create a via contact with an integral bump.

2. Description of Related Art

Currently, progress has been made in increasing chip processing power by stacking wafers containing different circuit functions, such as memory, logic, analog and digital.

One challenge to mass producing high-density, vertically integrated modules has been forming die interconnects within a vertical chip stack. Flip-chip does not allow for interconnecting more than two chips, and wire bonding is limited to the number of chips that can be stacked, requiring manufacturers to link chips over edges.

Conventional processes have been used to form uniform bumps on thin silicon substrates to connect multiple chips for an array of applications. However, these processes require multiple masks, plating, and CMP steps. Therefore, a new method is needed to ensure uniformity between through via contacts for use in thin substrates with fewer manufacturing steps.

DETAILED DESCRIPTION OF INVENTION

In an embodiment, the present invention is a through via contact formation process. In an embodiment, the through via contact formation process comprises forming a via opening in a semiconductor substrate that extends to a conductive layer, forming a bump recess in the semiconductor substrate, filling both via opening and bump recess with an insulative film and with a conductive material, planarizing the conductive material, and then etching back the semiconductor substrate so that a portion of the conductive material extends above the backside of the semiconductor substrate.

Figure 1E:
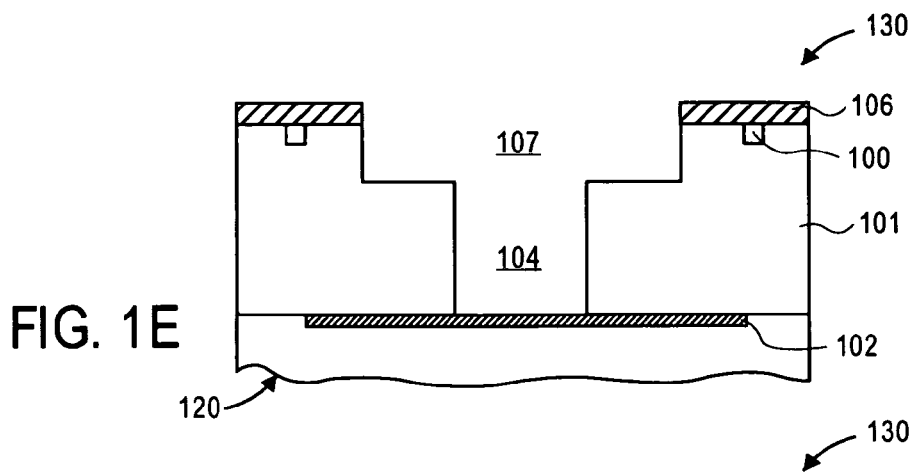
FIGS. 1A-1O are illustrations of an embodiment of the through via contact formation process of the present invention.
Figure 1F:
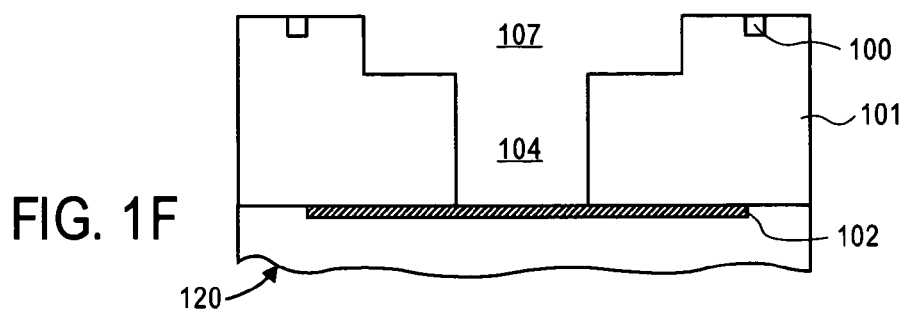
Figure 1G:
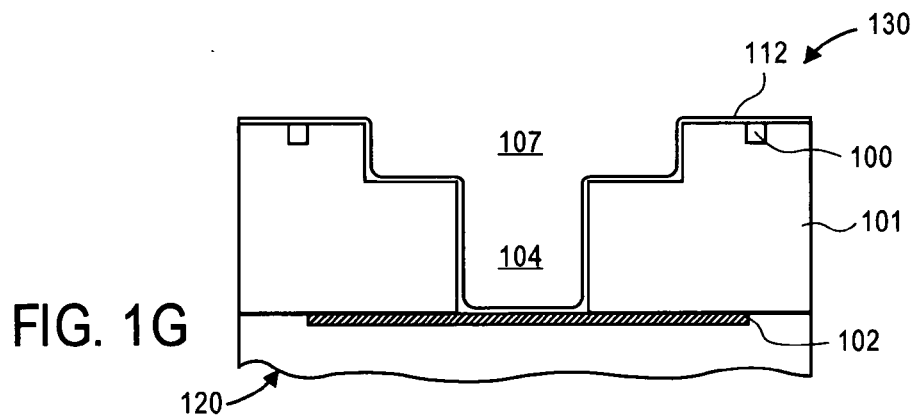
Figure 1H:
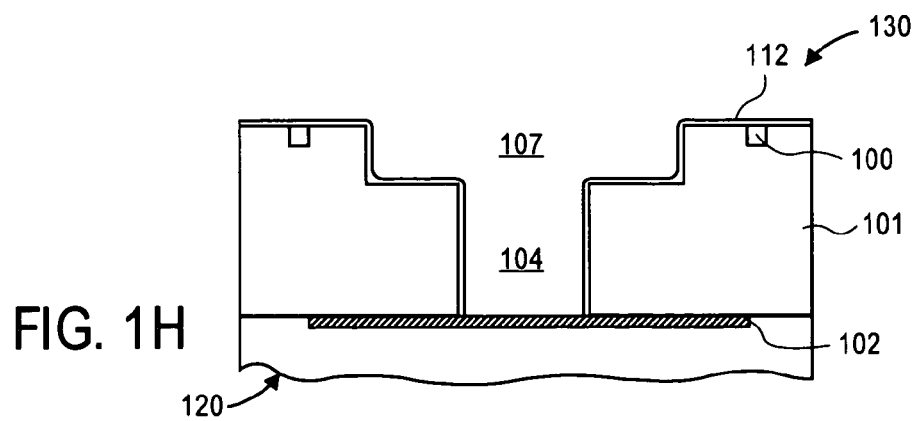
Figure 1I:
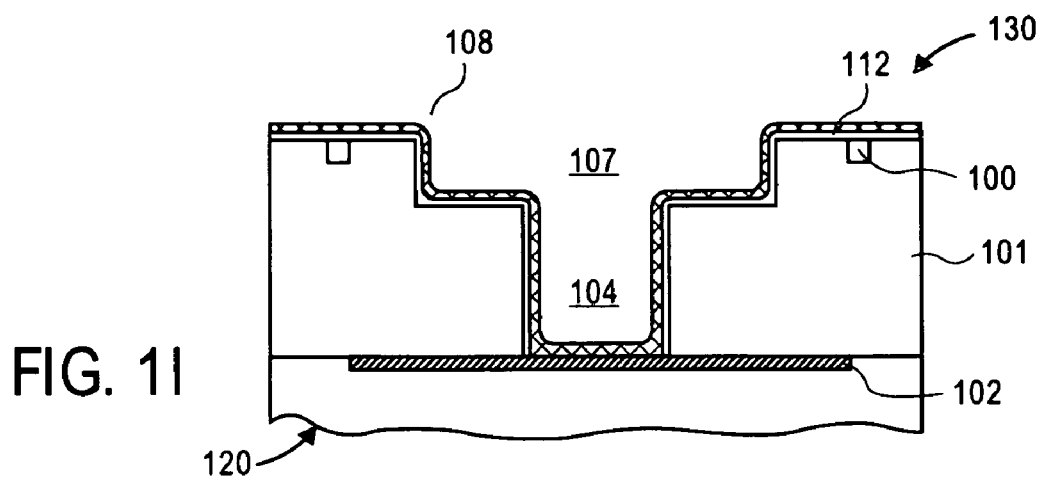
Figure 1J:
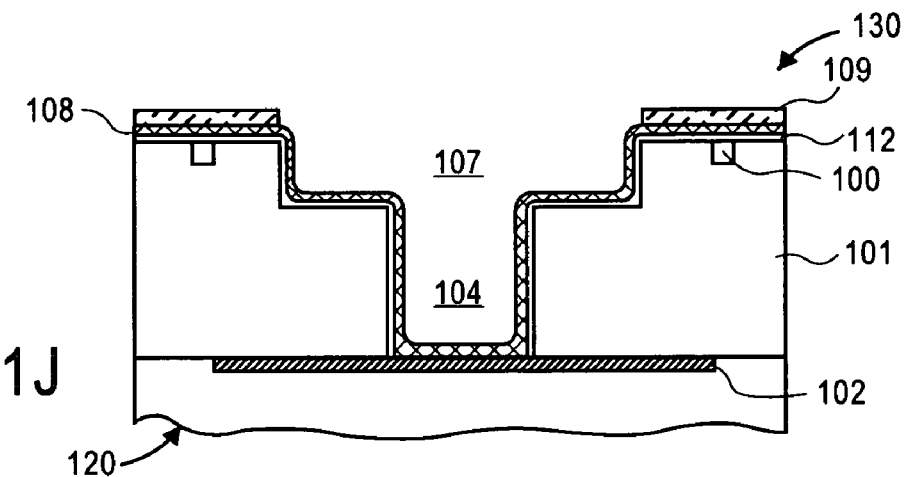
Figure 1K:
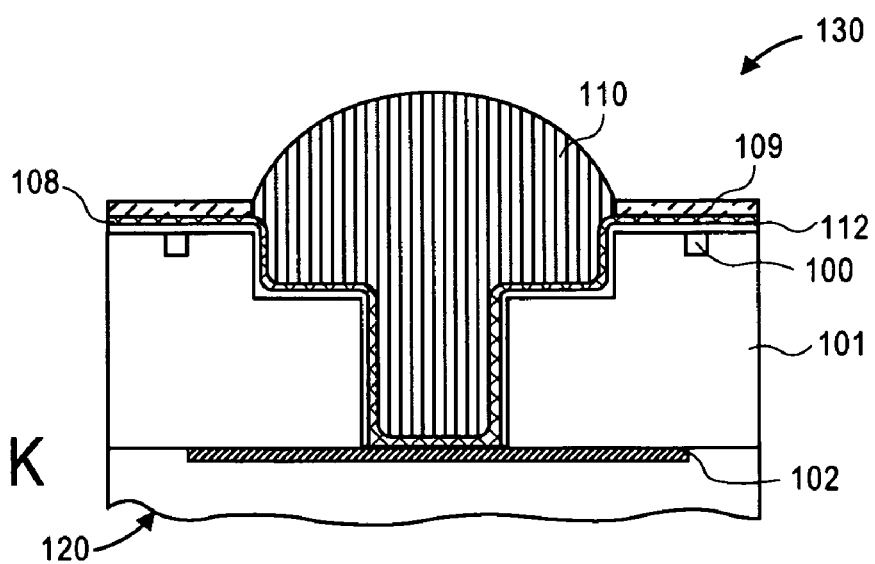
Figure 1L:
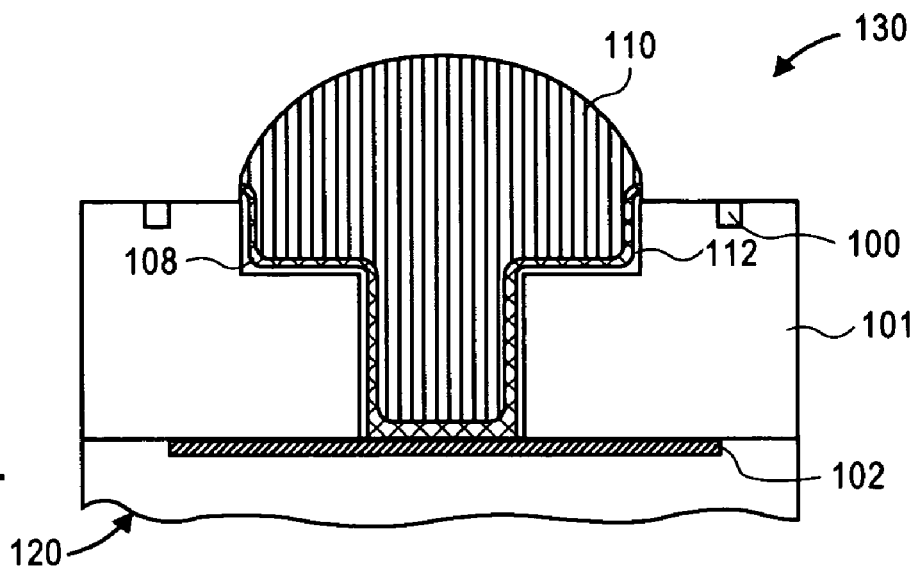
Figure 1M:
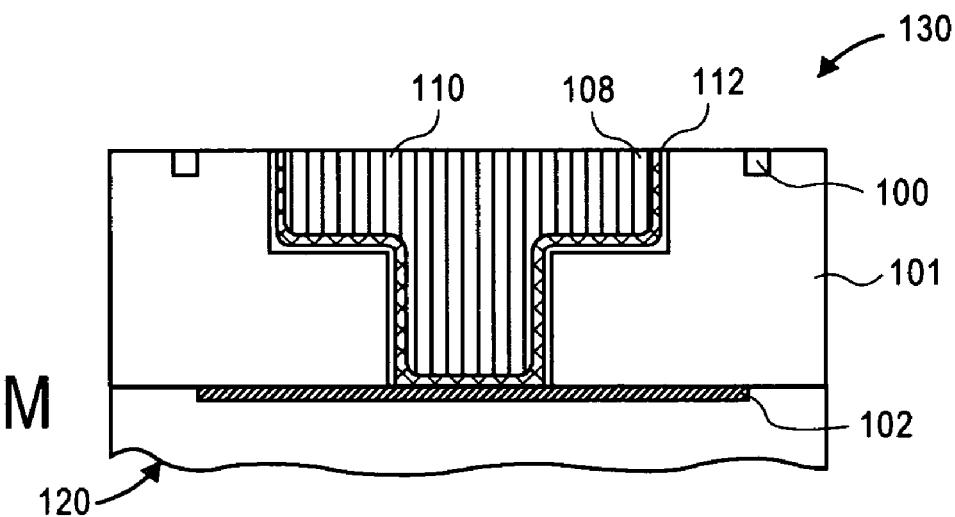
Figure 1N:
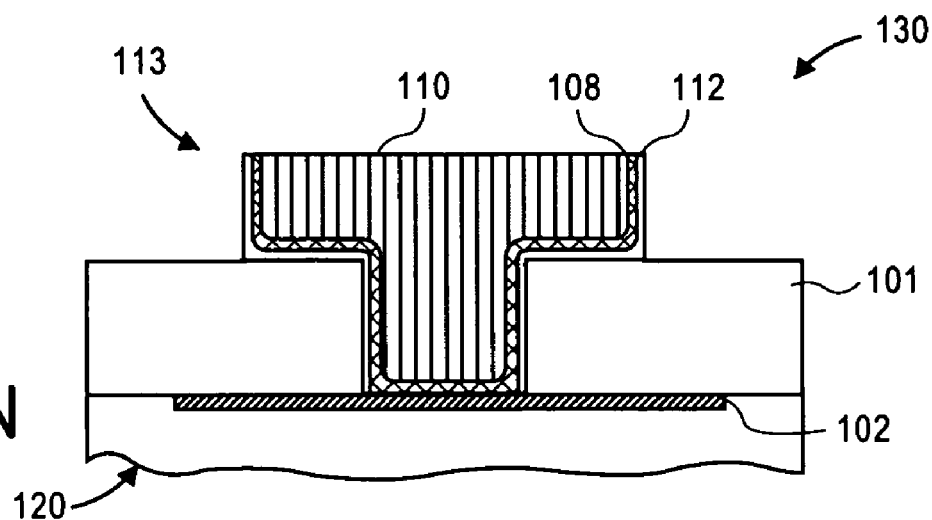
Figure 1O:
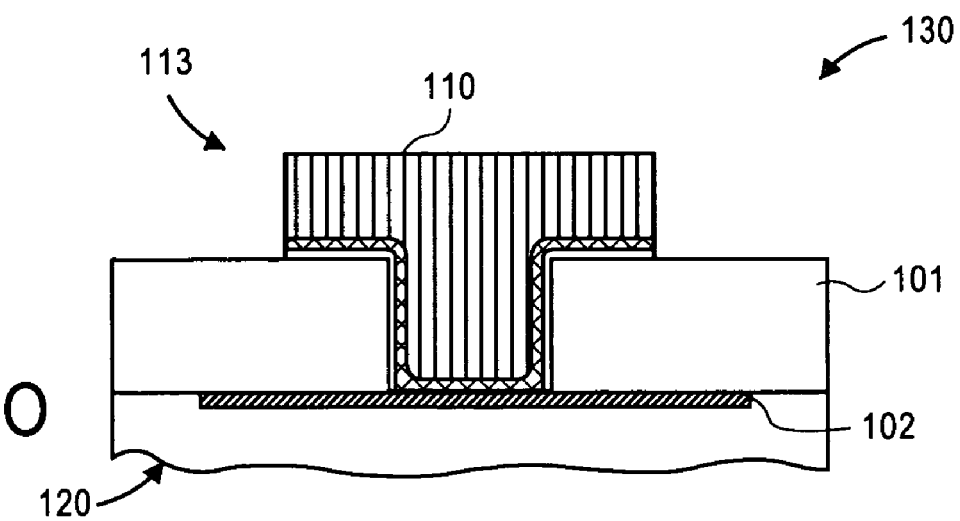

FIGS. 1A-1O illustrates a through via contact formation process in accordance with an embodiment of the present invention. The through via contact formation process of the present invention is advantageous because it facilitates using fewer steps than the prior art and does not require multiple mask steps common to dual damascene processes.

In forming a through via contact according to an embodiment of the present invention, a semiconductor substrate 101 is provided with a back side 130 and a device side 120 as illustrated in FIG. 1A. Back side 130 comprises the bulk substrate. Integrated circuitry including transistors, capacitors, interconnects, and other electrical devices are on device side 120. In an embodiment, semiconductor substrate 101 comprises mono-crystalline silicon. In other embodiments, semiconductor substrate 101 may comprise other materials such as, but not limited to GaAs, SiGe, and InP. In an embodiment, device side 120 includes an embedded conductive layer 102. In an embodiment, a through via is formed in semiconductor substrate to expose and make contact with the first conductive layer, metal 1. In an embodiment, conductive layer 102 comprises copper. In yet another embodiment, conductive layer 102 may be a diffusion region.

In an embodiment of the present invention, semiconductor substrate 101 is thinned prior to forming a through via contact. Thinning may occur before or after a wafer comprising semiconductor die are partitioned. In an embodiment, semiconductor substrate is thinned prior to partitioning wafer into individual die. Before thinning, the thickness of semiconductor substrate 101 may be in the range of 600 to 800 microns. In an embodiment, after thinning the thickness of semiconductor substrate 101 is approximately 100 microns.

In an embodiment, alignment marks 100 are formed on backside 130. Alignment marks 100 align the via opening to a desired conductive layer. Alignment marks 100 may be formed by any method suitable in the art. In an embodiment when semiconductor substrate 101 comprises silicon, alignment marks 100 are formed in semiconductor substrate 101 using a plasma silicon etch process. The number of alignment marks may vary. Alignment marks 100 may be aligned to the alignment marks made on device side 120. In an embodiment, cameras are used to project the location of alignment marks on device side 120 so alignment marks 100 may be formed in a parallel location on backside 130.

In accordance with an embodiment of the present invention, a resist layer is blanket deposited over backside 130. The resist layer is subsequently patterned into resist mask 103 by well known lithography steps such as masking, exposing, and developing to form a patterned resist mask 130 which defines a location where a via opening is to be formed in semiconductor substrate 101 as illustrated in FIG. 1A. In an embodiment, the opening in resist mask 103 is positioned above conductive layer 102 to which contact is desired.

Next, via opening 104 is formed in semiconductor substrate 101 as illustrated in FIG. 1B. Via opening 104 may be formed by any suitable method known in the art. In an embodiment, via opening 104 is formed by an etch-dep-etch process. In an embodiment when semiconductor substrate 101 comprises mono-crystalline silicon, the etch-dep-etch process comprises a first $SF_6$ isotropic etch into semiconductor substrate 101. The isotropic etch creates a small trench with a definable sidewall and bottom. Next, $C_4F_8$ is used to conformally deposit a fluorinated polymer on both the sidewalls and bottom of the trench. The process returns to etching the trench. The bottom of the trench is etched while the fluorinated polymer protects the sidewalls from being etched. Once the polymer on the sidewalls of the trench is etched completely, the process switches back to polymer deposition. In an embodiment, the etch-dep-etch process continues until via opening 104 extends through semiconductor substrate 101 to conductive layer 102. In an embodiment, 580 cycles of the etch-dep-etch process etches a via depth of 100 microns in semiconductor substrate 101 to expose conductive layer 102.

In an embodiment, via opening 104 may have a width in the range of 10 to 100 microns. The depth of via opening 104 may range from 75 to 150 microns. In an embodiment, via opening 104 has a width of 10 microns and a depth of 100 microns. Via opening 104 is formed in backside 130 and extends to and exposes conductive layer 102 as illustrated in FIG. 1B. Via opening 104 may extend to any conductive layer that makes up the circuitry integrated in semiconductor substrate 101. In an embodiment, via opening 104 extends to the first conductive layer of semiconductor substrate 101.

Next, a resist 105 layer is blanket deposited over semiconductor substrate 101 as illustrated in FIG. 1C. Resist 105 may comprise an anti-reflective coating (ARC), sacrificial light absorbing material (SLAM), or any material suitable to define a bump recess location. In an embodiment, a high viscosity resist 105 is used such that the viscosity of resist 105 prevents it from flowing to the bottom of via opening 104 to exposed conductive layer 102. A high viscosity resist may have a viscosity in the range from 100 to 3900 centipoises. In an embodiment, high viscosity resist 105 has a viscosity of 210 cps. An example of a high viscosity resist 105 is STR-1045 manufactured by Shipley. The use of a high viscosity resist 105 prevents defects such as focus spots, shell defects, and other problems associated with forming vias and trenches with high aspect ratios. Although SLAM has been developed and used in response to these problems, in an embodiment, SLAM is not used since high viscosity resist 105 does not reach the bottom of via opening 104. Therefore, the problems associated with conventional resists are avoided.

Next, resist 105 is patterned into resist mask 106, which defines a bump recess location as illustrated in FIG. 1D. Resist 105 may be patterned by well known lithography steps such as masking, exposing, and developing.

Next, bump recess 107 is formed in semiconductor substrate 101 defined by the bump recess pattern in resist mask 106 as illustrated in FIG. 1E. Bump recess 107 may be formed by an etch-dep-etch process, plasma etch or any suitable method known in the art. In an embodiment when semiconductor substrate 101 comprises mono-crystalline silicon, bump recess 107 can be formed by a similar etch-dep-etch process used to form via opening 104. Bump recess 107 encompasses a portion of via opening 104 but extends laterally through semiconductor substrate 101, such that the width of bump recess 107 is greater than the width of via opening 104 as illustrated in FIG. 1E. The width of bump recess 107 can range from 50 to 100 microns. In an embodiment, the width of bump recess 107 is 60 microns. The depth of bump recess 107 can range from 30 to 50 microns. In an embodiment, the depth of bump recess 107 is 30 microns. Finally, resist mask 106 is removed from semiconductor substrate 101 after bump recess 107 is formed as illustrated in FIG. 1F. Resist mask 106 may be removed by a dry etch or any suitable method known in the art.

Next, an insulative film 112 is formed in via opening 104 and bump recess 107 prior to formation of a conductive material as illustrated in FIG. 1G. Insulative film 112 may be formed by oxidation, deposition, or any suitable method known in the art. In an embodiment, insulative film 112 is formed by a deposition process. Insulative film 112 may comprise oxide. In an embodiment, insulative film 112 comprises oxide and is formed to a thickness which provides suitable isolation between the conductive material and semiconductor substrate 101. In an embodiment, insulative film can have a thickness in the range from 0.5 to 1 micron. In an embodiment, insulative film 112 has a thickness of approximately 0.65 microns.

Next, insulative film 112 is etched to expose conductive layer 102 as illustrated in FIG. 1H. Insulative film 112 may be etched by any suitable method known in the art. In an embodiment when semiconductor substrate 101 comprises mono-crystalline silicon, insulative film 112 is etched using a plasma etch selective to oxide. In an embodiment when the thinnest portion of insulative film 112 is flush with conductive layer 102, backside 130 is plasma etched such that the portion of insulative film 112 flush with conductive layer 102 is removed completely and the remaining portions of insulative film 112 are only partially etched. In an embodiment, the sidewall portions of insulative film 112 are partially protected due to the directionality of the plasma etch. In an embodiment, the portion of insulative film 112 on backside 130 and the portion in bump recess 107 are thicker than the portion of insulative film 112 flush with conductive layer 102, which prevents them from complete etch removal. In an embodiment, $CF_4$, $CHF_3$, and Argon are gases used to plasma etch insulative film 112.

Next, via opening 104 and bump recess 107 are filled with a conductive material. The conductive material may comprise a single conductive film or multiple conductive films or layers.

In an embodiment, a conductive material includes a seed metal layer 108 formed in via opening 104 and bump recess 107, as illustrated in FIG. 1I. Seed metal layer 108 may be formed by CVD, ALD, sputtering, or any suitable method known in the art. In an embodiment, seed metal layer 108 is formed by sputtering. In an embodiment, seed metal layer 108 comprises both an adhesion and barrier layer. In an embodiment, the adhesion layer comprises tantalum and the barrier layer comprises tantalum nitride. The thickness of both tantalum layer and tantalum nitride layer may be each approximately 1 micron. In an embodiment, the thicknesses of both tantalum layer and tantalum nitride layer are approximately 1100 angstroms each. In an embodiment, seed metal layer 108 also comprises a layer to promote growth of a subsequent electroplated conductive material. In an embodiment, a copper seed layer is formed to promote growth of copper during subsequent copper electroplating in via opening 104 and bump recess 107. The thickness of the copper seed layer may be formed to 1000 angstroms to 3 microns. In an embodiment, the thickness of the copper seed layer is approximately 1.2 microns. The thickness of seed metal layer 108 may range from 0.2 microns to 3 microns.

Next, a resist mask 109 is formed over semiconductor substrate 101 as illustrated in FIG. 1J to define the perimeter of the conductive material subsequently formed in bump recess 107 and via opening 104.

Next, a conductive material 110 is formed in bump recess 107 and via opening 104 as illustrated in FIG. 1K. Conductive material 110 may be formed by any method suitable in the art such that conductive material 110 fills and exceeds bump recess 107 and via opening 104. In an embodiment, conductive material 110 must be completely fill and exceed bump recess 107 and via opening 104 to prevent tear out, corrosion, or other defects. In an embodiment, conductive material 110 is formed in bump recess 107 and via opening 104 by electroplating or electroless plating. Conductive material 110 may comprise any material suitable to provide adequate conductivity to conductive layer 102. In an embodiment, conductive material 110 comprises copper.

Next, in an embodiment, conductive material 110, seed metal layer 108, insulative film 112, and resist 109 exterior to bump recess 107 and exterior to via opening 104 are removed from backside 130. Resist 109 may be removed by dry etching or any method suitable in the art. In an embodiment, seed metal layer 108 is removed by a wet etch technique. Insulative layer 112 may be removed by plasma etching, chemical mechanical polishing, or any suitable method known in the art. FIG. 1L illustrates backside 130 after resist 109, insulative film 112, and seed metal layer 108 exterior to via opening 104 and exterior to bump recess 107 have been removed. Next conductive material 110 is planarized to backside 130. In an embodiment, conductive material 110 is planarized by chemical mechanical polishing. FIG. 1M illustrates backside 130 after removal of conductive material 110, seed metal layer 108, insulative film 112, and resist 109 exterior to bump recess 107 and exterior to via opening 104.

In an embodiment, conductive material 110, seed metal layer 108, and insulative film 112 exterior to bump recess 107 and exterior to via opening 104 may be removed entirely by planarization as opposed to the etch/planarization process combination previously described. In an embodiment, conductive material 110 is chemical mechanically polished down to the vertical height of seed metal layer 108. Next, in an embodiment, conductive material 110, seed metal layer 108, and insulative film 112 are chemical mechanically polished down to backside 130 surface of semiconductor substrate 101. In an embodiment, backside 130 is substantially planarized as illustrated in FIG. 1M.

Next, backside 130 is etched back such that a portion of conductive material 110, seed metal layer 108, and insulative film 112 are exposed as illustrated in FIG. 1N. In an embodiment, the etchant used to etch backside 130 has a chemistry which is selective to semiconductor substrate 101 and not conductive material 110, seed metal layer 108, or insulative film 112. In an embodiment when semiconductor substrate 101 comprises mono-crystalline silicon, a plasma silicon etch is used to etch back semiconductor substrate 101 to expose conductive material 110. In an embodiment, $SF_6$ is used during the plasma silicon etch to etch back a silicon substrate isotropically. In an embodiment, exposed metal 113 is approximately equal to the depth of bump recess 107. In an embodiment, exposed metal 113 is rigid and resilient to withstand stress during thermal cycling.

In an embodiment, the perimeter portion of insulative film 112 and seed metal layer 108 are removed from exposed metal 113. After removal, the perimeter of exposed metal 113 comprises conductive material 110 as illustrated in FIG. 1O. The lateral portion of insulative film 112 on exposed metal 113 may be removed by an HF wet etch, buffered oxide etch, plasma etching or any suitable method known in the art. In an embodiment when insulative film 112 comprises oxide, the lateral portion of insulative film 112 on exposed metal 113 is removed by subjecting backside 130 to a buffered oxide etch, which is selective to oxide. In an embodiment, the lateral portion of seed metal layer 108 is removed from exposed metal 113 by a plasma etch. In an embodiment, both the lateral portion of insulative film 112 and seed metal layer 108 on exposed metal 113 is removed by a plasma etching backside 130.

Figure 2:
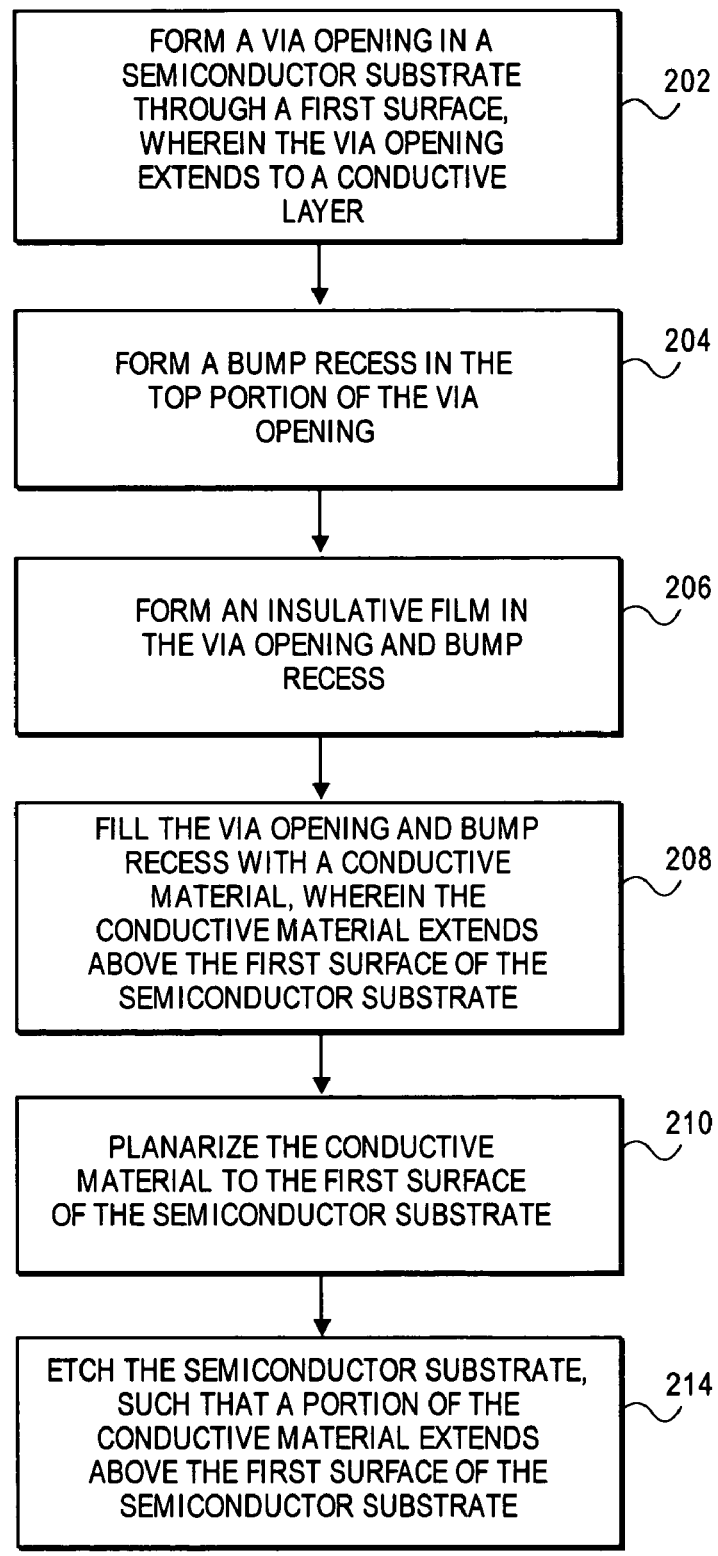
FIG. 2 is a flowchart of an embodiment of the through via contact formation process of the present invention.

FIG. 2 illustrates a method of forming a through via contact according to an embodiment of the present invention as set forth by the blocks in flowchart 200. First, a via opening is formed in a semiconductor substrate through a first surface, which extends to a conductive layer as set forth in block 202. Next, a bump recess is formed in the top portion of the via opening as set forth in block 204. Then an insulative film is formed in the via opening and bump recess as set forth in process block 206. Next, the via opening and bump recess is filled with a conductive material so that the conductive material extends above the first surface of the semiconductor substrate as set forth in process block 208. Then, the conductive material is planarized to the first surface of the semiconductor substrate as set forth in process block 210. Next, a semiconductor substrate is etched such that a portion of the conductive material extends above the first surface of the semiconductor substrate as set forth in process block 214.

The through via contact formation process of the current invention is used for connecting multiple semiconductor die such as but not limited to SRAM, flash cells, and voltage regulators. Connecting multiple dies may have numerous applications. In an embodiment, dies are connected to increase memory.

Figure 3:
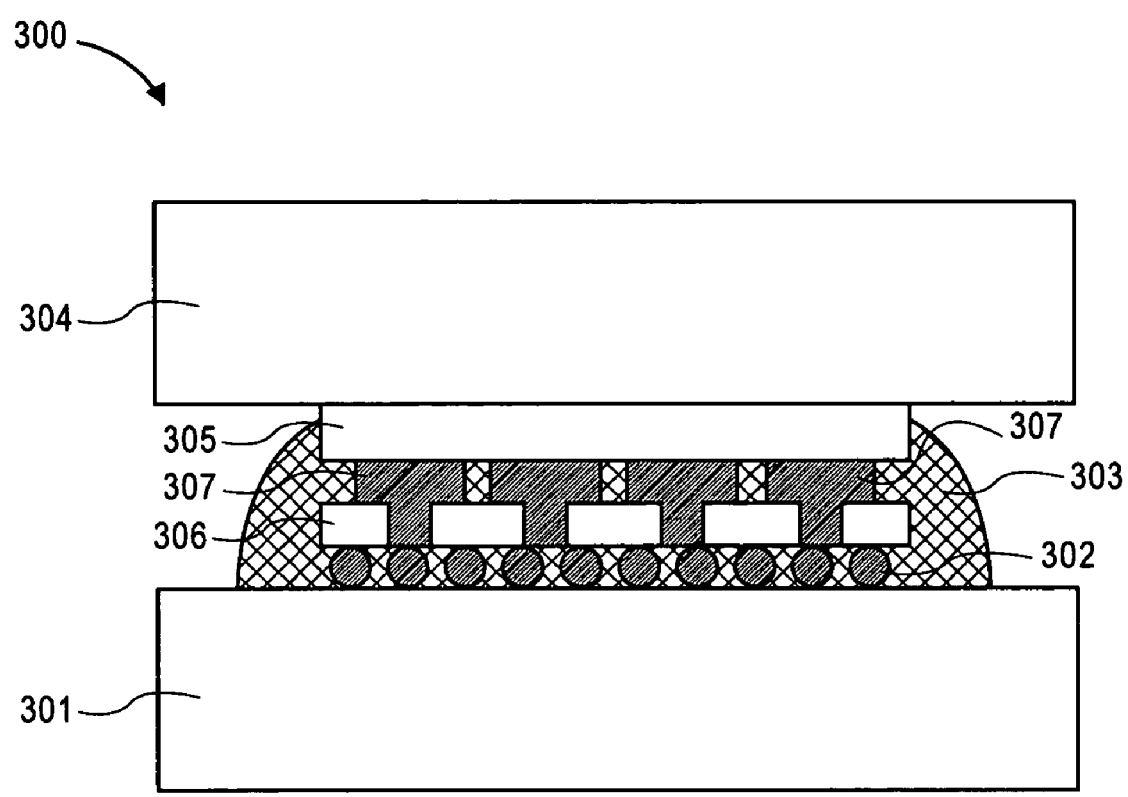
FIG. 3 is an illustration of an electronic package comprising two semiconductor die connected by a through via contact.

FIG. 3 illustrates two semiconductor die electrically connected by the through via contact formation of the present invention. Electronic package 300 comprises conventional components: an integrated heat spreader 304, underfill material 303, bump 302, substrate 301, first die 305 and second die 306. According to an embodiment of the present invention, through via 307, electrically connects first die 305 and second die 306.

The invention claimed is:

1. A method of forming a through via contact comprising:
    forming a via opening in a semiconductor substrate through a first surface, wherein said via opening extends to a conductive layer;
    forming a bump recess in the top portion of said via opening;
    forming an insulative film in said via opening and said bump recess;
    filling said via opening and said bump recess with a conductive material, wherein said conductive material extends above the first surface of said semiconductor substrate;
    planarizing said conductive material to the first surface of said semiconductor substrate;
    etching to remove a portion of said semiconductor substrate from said first surface of said semiconductor substrate such that a portion of said conductive material extends above a surface of said semiconductor substrate.

2. The method of claim 1, wherein said semiconductor substrate is thinned prior to forming said through via contact.

3. The method of claim 2, wherein said semiconductor substrate is thinned to a thickness of approximately 100 microns.

4. The method of claim 1, wherein said semiconductor substrate comprises alignment marks on said first surface for forming said via opening.

5. The method of claim 1, wherein said first surface is the backside of said semiconductor substrate.

6. The method of claim 1, wherein said conductive material comprises a seed metal layer.

7. A method of forming a through via contact comprising:
    forming a via opening in the backside of a semiconductor substrate, wherein said via opening extends to a conductive layer on the device side of said semiconductor substrate;
    patterning a first resist for a bump recess pattern in the top portion of said via opening, wherein said first resist does not reach the bottom of said via opening;
    etching a bump recess in the top portion of said via opening;
    forming an insulative film in said via and said bump recess;
    etching said insulative film to expose said conductive layer;
    filling said via opening and said bump recess with a conductive material, wherein said conductive material extends above the backside of said semiconductor substrate;
    planarizing said conductive material to the backside of said semiconductor substrate;
    etching to remove a portion of said semiconductor substrate from said backside of said semiconductor substrate such that a portion of said conductive material extends above a surface of said semiconductor substrate.

8. The method of claim 7, wherein said semiconductor substrate comprises mono-crystalline silicon.

9. The method of claim 7, wherein said conductive material comprises copper.

10. The method of claim 7, wherein said bump recess extends laterally through a portion of said semiconductor substrate; wherein the width of said bump recess is greater than the width of said via opening.

11. The method of claim 7, wherein the viscosity of said first resist prevents said first resist from flowing to the bottom of said via.

12. A method of forming a through via contact comprising:
patterning a first resist for a via opening pattern over the backside of a semiconductor substrate, wherein a conductive layer is in the device side of said semiconductor substrate;
etching a via opening in said semiconductor substrate, wherein said via opening extends through said semiconductor substrate to said conductive layer;
removing said first resist;
applying a second resist over the backside of said semiconductor substrate;
forming a bump recess pattern in said second resist;
etching a bump recess in said semiconductor substrate;
removing said second resist;
forming an insulative film in said bump recess and said via opening;
etching said insulative film to expose said conductive layer;
forming a seed metal layer in said bump recess and said via opening;
applying a third resist over the backside of said semiconductor substrate;
patterning a bump pattern in said bump recess;
filling said via opening and said bump recess with a conductive material comprising copper;
removing said third resist;
removing said seed metal layer exterior to said bump recess and exterior to said via opening;
removing said insulative film exterior to said bump recess and exterior to said via opening;
planarizing said conductive material to the backside of said semiconductor substrate;
etching back said semiconductor substrate from the backside of said semiconductor substrate to expose portions of said insulative film, said seed metal layer and said conductive material comprising copper;
etching said exposed portions of said insulative film and said seed metal layer from said exposed portion of said conductive material to provide a lateral perimeter of said exposed portion of said conductive material comprising copper.

13. The method of claim 12, wherein said etching a via opening in said semiconductor substrate comprises a plasma etch process.

14. The method of claim 12, wherein the depth of said via opening is in the range of 75 to 150 microns.

15. The method of claim 12, wherein the width of said via opening is in the range of 10 to 100 microns.

16. The method of claim 12, wherein the viscosity of said third resist is in the range of 100 to 3900 centipoise.

17. The method of claim 12, wherein the width of said bump recess is in the range of 50 to 100 microns.

18. The method of claim 12, wherein said forming of said seed metal layer comprises sputtering.

19. The method of claim 12, wherein said seed metal layer comprises a tantalum layer, tantalum nitride layer, and a copper layer.

20. The method of claim 12, wherein the thickness of said insulative film is in the range of 0.5 to 1.0 microns.

21. The method of claim 12, wherein said filling of said bump recess and said via opening with a conductive material comprises electroplating.

22. The method of claim 12, wherein said seed metal layer has a thickness in the range of 0.2 microns to 3 microns.

23. The method of claim 12, wherein said planarizing of said conductive material comprises chemical mechanical polishing.

* * * * *